US012328988B2

(12) United States Patent
Park et al.

(10) Patent No.: US 12,328,988 B2
(45) Date of Patent: Jun. 10, 2025

(54) DISPLAY APPARATUS INCLUDING THERMAL SPREADING SHEET

(71) Applicant: Samsung Display Co., Ltd., Yongin-si (KR)

(72) Inventors: Byoungkyoo Park, Yongin-si (KR); Wee-Joon Jeong, Seongnam-si (KR); Jangun Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 537 days.

(21) Appl. No.: 17/856,420

(22) Filed: Jul. 1, 2022

(65) Prior Publication Data

US 2023/0062576 A1 Mar. 2, 2023

(30) Foreign Application Priority Data

Aug. 23, 2021 (KR) .................. 10-2021-0111188

(51) Int. Cl.
*H10K 50/87* (2023.01)
*H05K 1/18* (2006.01)
*H10K 50/844* (2023.01)
*H10K 59/38* (2023.01)
*H10K 50/842* (2023.01)

(52) U.S. Cl.
CPC ............ *H10K 50/87* (2023.02); *H05K 1/189* (2013.01); *H10K 50/844* (2023.02); *H10K 59/38* (2023.02); *H05K 2201/10128* (2013.01); *H10K 50/8428* (2023.02)

(58) Field of Classification Search
CPC .. H10K 50/87; H10K 50/844; H10K 50/8428; H10K 59/38; H10K 59/12; H10K 50/8794; H05K 1/189
See application file for complete search history.

(56) References Cited

U.S. PATENT DOCUMENTS

| 7,160,619 | B2 | 1/2007 | Clovesko et al. |
| 7,176,605 | B2 | 2/2007 | Bae et al. |
| 7,276,273 | B2 | 10/2007 | Clovesko et al. |
| 7,362,042 | B2 | 4/2008 | Bae et al. |
| 10,355,059 | B2 | 7/2019 | Lee et al. |

(Continued)

FOREIGN PATENT DOCUMENTS

| JP | 2012-229392 | 11/2012 |
| JP | 2015-205986 | 11/2015 |

(Continued)

*Primary Examiner* — Ida M Soward
(74) *Attorney, Agent, or Firm* — KILE PARK REED & HOUTTEMAN PLLC

(57) ABSTRACT

A display apparatus includes a display panel including a display region, a non-display region adjacent to the display region, and a pixel that provides light to the display region, a thermal spreading sheet disposed below the display panel and including a first layer, a second layer, and a third layer, the second layer having a thermal conductivity less than a thermal conductivity of the first layer, and an adhesive layer disposed between the thermal spreading sheet and the display panel and including a light absorbing material. The first layer and the third layer each have a horizontal thermal resistance in a range of about 1 K/J to about 20 K/J, and the second layer has a vertical thermal resistance in a range of about 500 K/J to about 2000 K/J.

20 Claims, 9 Drawing Sheets

(56) References Cited

U.S. PATENT DOCUMENTS

| | | | |
|---|---|---|---|
| 10,454,074 B2 | 10/2019 | Lee et al. | |
| 10,815,396 B2 | 10/2020 | Suzuki et al. | |
| 2006/0113894 A1* | 6/2006 | Fujii | H10D 30/6743 |
| | | | 257/E29.147 |
| 2007/0132361 A1* | 6/2007 | Chung | H01J 65/04 |
| | | | 313/493 |
| 2008/0105875 A1* | 5/2008 | Maekawa | H10D 30/6732 |
| | | | 257/E21.414 |
| 2011/0018416 A1 | 1/2011 | Sassa | |
| 2014/0037924 A1 | 2/2014 | Furuta et al. | |
| 2014/0345843 A1* | 11/2014 | Kirkor | F28F 21/02 |
| | | | 165/185 |
| 2017/0344053 A1* | 11/2017 | Kim | G02F 1/0102 |
| 2018/0286924 A1* | 10/2018 | Lee | G06F 1/1626 |
| 2019/0205594 A1* | 7/2019 | Lee | H10K 59/12 |

FOREIGN PATENT DOCUMENTS

| | | |
|---|---|---|
| KR | 10-0521475 | 10/2005 |
| KR | 10-2010-0078455 | 7/2010 |
| KR | 10-2011-0000888 | 1/2011 |
| KR | 10-2011-0004374 | 1/2011 |
| KR | 10-2011-0044644 | 4/2011 |
| KR | 10-2014-0126694 | 10/2014 |
| KR | 10-2015-0126336 | 11/2015 |
| KR | 10-2017-0076907 | 7/2017 |
| KR | 10-2018-0110947 | 10/2018 |
| KR | 10-2019-0049520 | 5/2019 |
| KR | 10-2039136 | 10/2019 |
| KR | 10-2052470 | 12/2019 |

* cited by examiner

DISPLAY APPARATUS INCLUDING THERMAL SPREADING SHEET

CROSS REFERENCE TO RELATED APPLICATION(S)

This U.S. non-provisional patent application claims priority to and the benefit of Korean Patent Application No. 10-2021-0111188 under 35 U.S.C. § 119, filed on Aug. 23, 2021, in the Korean Intellectual Property Office (KIPO), the entire contents of which are incorporated herein by reference.

BACKGROUND

1. Technical Field

The disclosure herein relates to a display apparatus including a thermal spreading sheet.

2. Description of the Related Art

A display apparatus may include a transmissive display panel that selectively transmits source light generated from a light source and a luminescent display panel that generates source light from the display panel itself. The display panel may include different types of color control layers according to pixels to generate a color image. The color control layers may transmit only the source light in a partial wavelength range or may convert the color of the source light. Some types of color control layers may change the characteristics of the light without changing the color of the source light.

SUMMARY

The disclosure provides a thermal spreading sheet that efficiently emits heat generated by the display panel.

An embodiment of a display apparatus may include a display panel that includes a display region, a non-display region adjacent to the display region, and a pixel that provides light to the display region; a thermal spreading sheet disposed below the display panel and including a first layer, a second layer, and a third layer, the second layer having a thermal conductivity less than a thermal conductivity of the first layer; and an adhesive layer disposed between the thermal spreading sheet and the display panel and including a light absorbing material. The first layer and the third layer each may have a horizontal thermal resistance in a range of about 1 K/J and about 20 K/J, and the second layer may have a vertical thermal resistance in a range of about 500 K/J and about 2000 K/J.

In an embodiment, each of the first layer and the third layer may include at least one of silver, copper, gold, silicon carbide, and aluminum.

In an embodiment, the second layer may include at least one of polyethylene, polyester, and polyethylene terephthalate.

In an embodiment, the first layer and the third layer may each have a thickness in a range of about 0.15 mm and about 1 mm, and the second layer may have a thickness in a range of about 0.05 mm and about 1 mm.

In an embodiment, wherein the thermal spreading sheet may have a total thickness of about 0.5 mm or more.

In an embodiment, the first layer and the third layer may each have a thermal conductivity in a range of about 100 W/mK and about 500 W/mK, and the second layer may have a thermal conductivity in a range of about 0.1 W/mK and about 0.5 W/mK.

In an embodiment, the display apparatus may include a coating layer spaced apart from the second layer and in contact with the third layer. The third layer is disposed between the coating layer and the second layer.

In an embodiment, the coating layer may have an emissivity of about 0.9 or more.

In an embodiment, the coating layer may have a thickness of about 50 μm or less.

In an embodiment, the display apparatus further including a window disposed on the display panel, wherein the third layer may be coupled to the window, and the window and the coating layer may define an external appearance of the display apparatus.

In an embodiment, the adhesive layer may have a thickness of about 50 μm or less.

In an embodiment, the adhesive layer may have a black color.

In an embodiment, the thermal spreading sheet may be divided into a first region overlapping the display region and a second region overlapping the non-display region, the second layer may be disposed only in the first region, and the first layer and the third layer may be in contact with each other in the second region.

In an embodiment, the thermal spreading sheet may include a first region overlapping the display region, a second region overlapping the non-display region, a first pattern disposed in the first region, and a second pattern disposed in the second region. The first pattern may have a thermal conductivity less than a thermal conductivity of the second pattern.

In an embodiment, the thermal spreading sheet may further include a fourth layer and a fifth layer. The fourth layer may be spaced apart from the second layer and may have a thermal conductivity less than a thermal conductivity of the third layer. The fourth layer and the second layer may include a same material, and the fifth layer and the first layer may include a same material.

In an embodiment, the display apparatus may include a main circuit board; and a flexible circuit board which may be disposed in the non-display region of the display panel and connecting the display panel and the main circuit board; a driving chip disposed on the flexible circuit board; and another thermal spreading sheet disposed on the flexible circuit board, the another thermal spreading sheet covering the driving chip. The another thermal spreading sheet and the thermal spreading sheet may include a same layer structure.

In an embodiment, the display panel may include a base substrate in contact with the adhesive layer; a circuit device layer disposed on the base substrate, the circuit device layer including a transistor; a display device layer including a light-emitting device, the light-emitting device including a first electrode connected to the transistor, a second electrode, and a light-emitting layer disposed between the first electrode and the second electrode; a first encapsulation layer covering the display device layer; and a light control layer disposed on the first encapsulation layer, and the light control layer may include quantum dots converting the wavelength of source light provided from the display device layer.

In an embodiment, the light control layer may include a partition wall disposed on the first encapsulation layer and not overlapping the light-emitting layer; a light control pattern overlapping the light-emitting layer; a second encapsulation layer covering the light control pattern; a color filter disposed on the second encapsulation layer; and a protective layer covering the color filter. The light control pattern may include the quantum dots.

In an embodiment, the light-emitting device may include a first light-emitting device, a second light-emitting device, and a third light-emitting device that generate the source light. A light-emitting layer of the first light-emitting device, a light-emitting layer of the second light-emitting device, and a light-emitting layer of the third light-emitting device have an integral shape.

In an embodiment, the source light may be blue light.

BRIEF DESCRIPTION OF THE DRAWINGS

The accompanying drawings are included to provide a further understanding of the embodiments, and are incorporated in and constitute a part of this specification. The drawings, together with the description, explain the embodiments. In the drawings.

DETAILED DESCRIPTION OF THE EMBODIMENTS

Figure 1A:
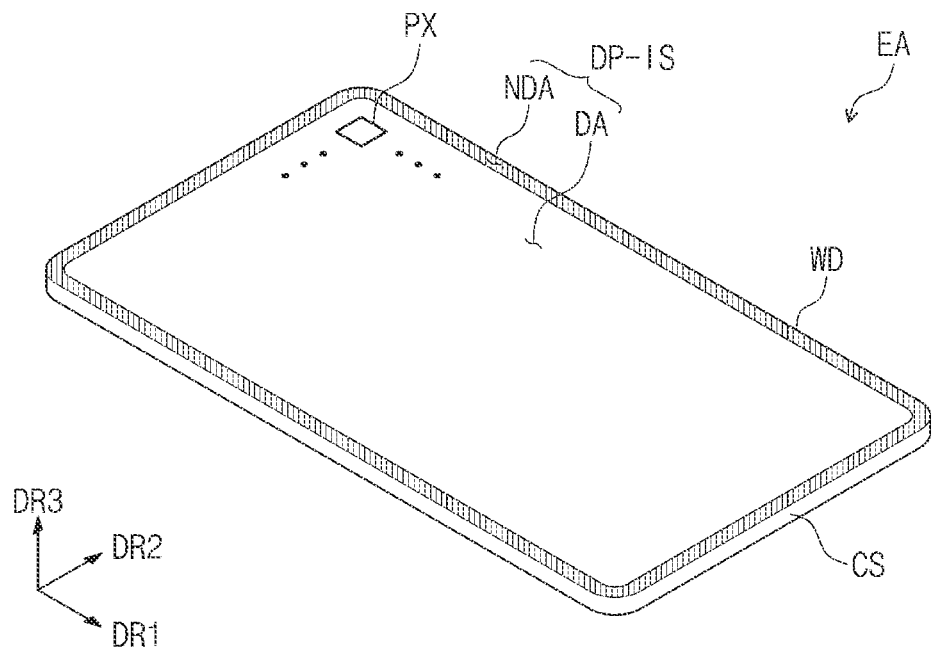
FIG. 1A is a perspective view of a display apparatus according to an embodiment.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Like reference numerals or symbols refer to like elements throughout. The thickness and the ratio and the dimension of the element are exaggerated for effective description of the technical contents. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the specification and the claims, the phrase "at least one of" is intended to include the meaning of "at least one selected from the group of" for the purpose of its meaning and interpretation. For example, "at least one of A and B" may be understood to mean "A, B, or A and B."

Hereinafter, the embodiments will be described with reference to the accompanying drawings.

Figure 1B:
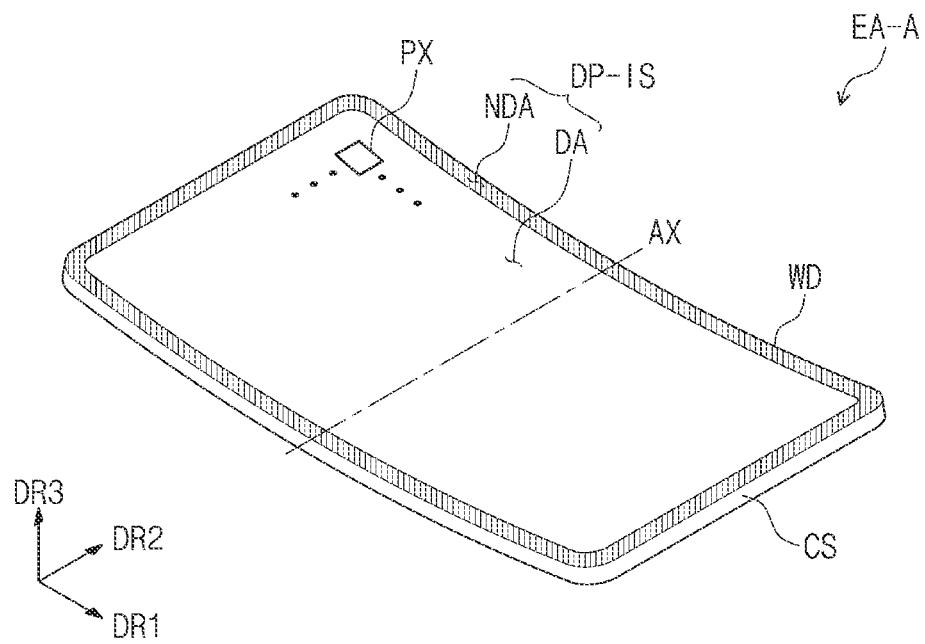
FIG. 1B is a perspective view of a curved display apparatus according to an embodiment.
Figure 1C:
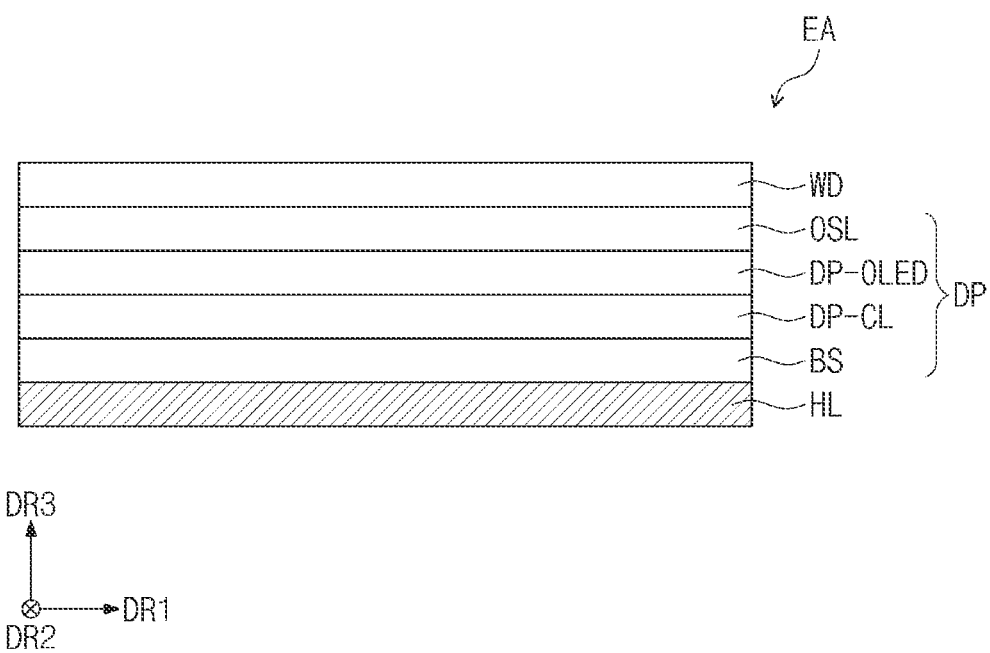
FIG. 1C is a schematic cross-sectional view of a display apparatus according to an embodiment.
Figure 1D:
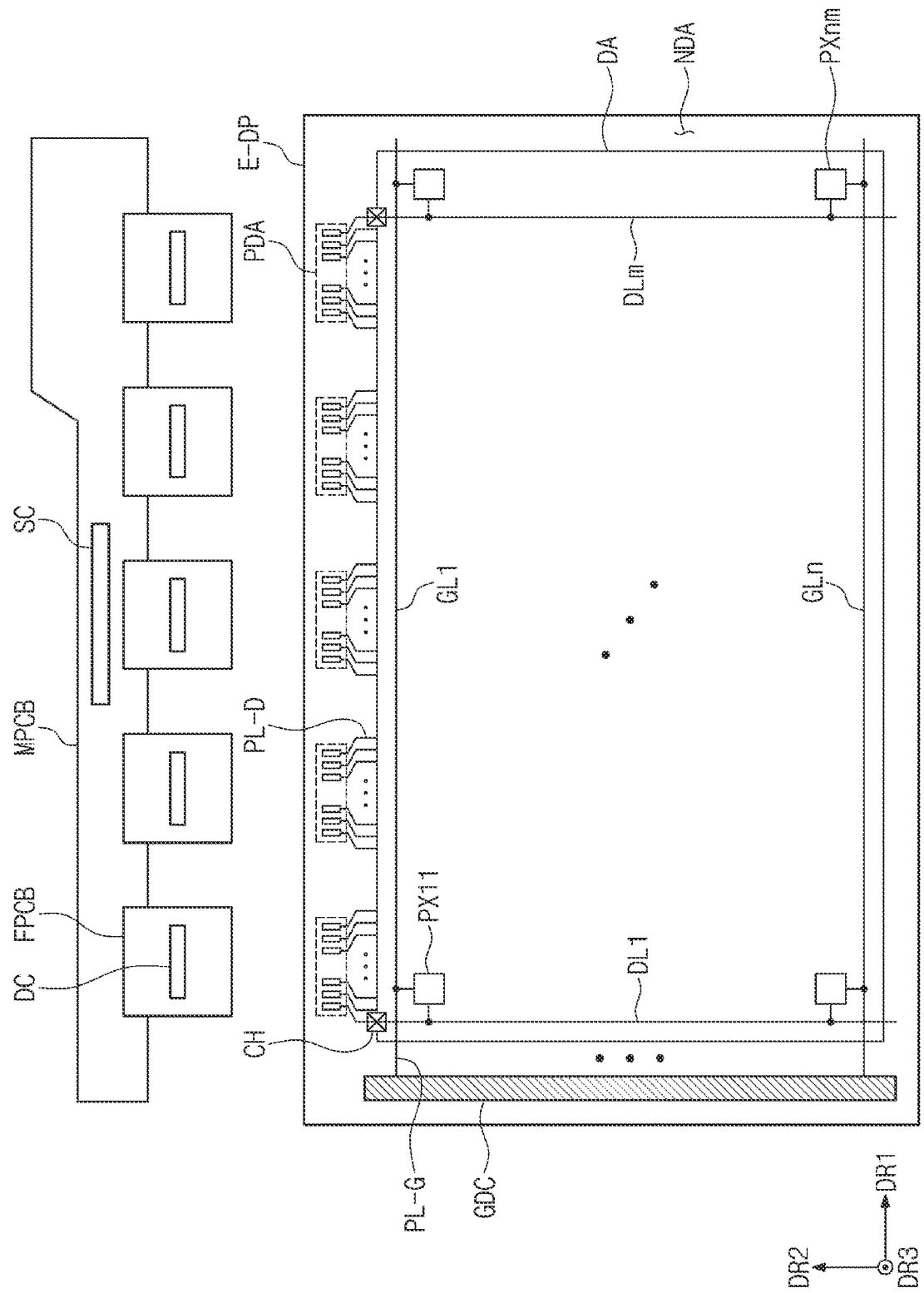
FIG. 1D is a plan view of a display panel according to an embodiment.
Figure 2:
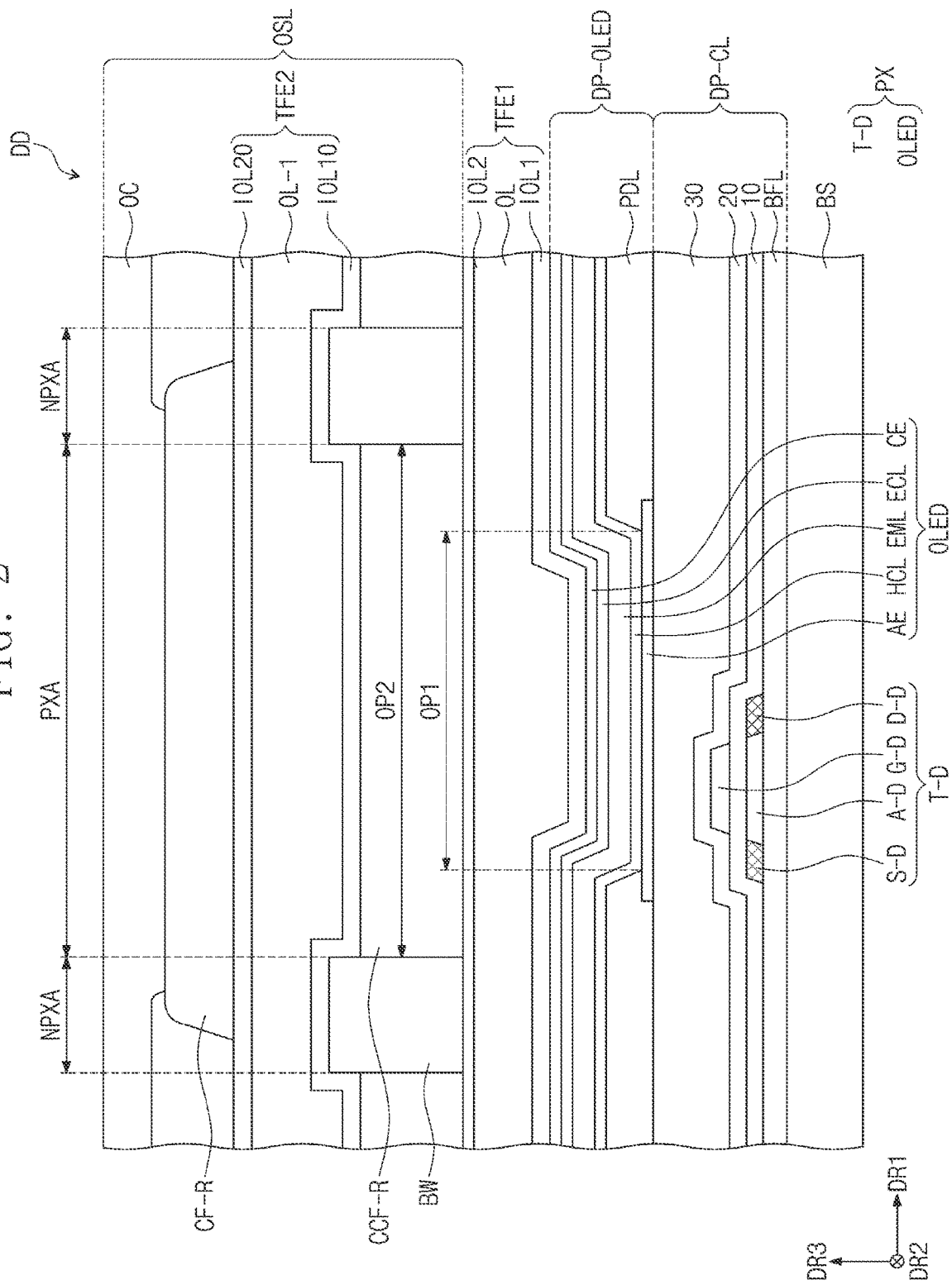
FIG. 2 is a schematic cross-sectional view of a pixel according to an embodiment.

FIG. 1A is a perspective view of a display apparatus according to an embodiment. FIG. 1B is a perspective view of a curved display apparatus according to an embodiment. FIG. 1C is a schematic cross-sectional view of a display apparatus according to an embodiment. FIG. 1D is a plan view of a display panel according to an embodiment. FIG. 2 is a schematic cross-sectional view of a pixel according to an embodiment.

Referring to FIG. 1A, the display apparatus EA may display an image through a display surface DP-IS. The display surface DP-IS is parallel to a plane defined by the first direction DR1 and the second direction DR2. The upper surface of a member disposed on the uppermost side of the display apparatus EA may be defined as the display surface DP-IS. According to an embodiment, the upper surface of a window WD illustrated in FIG. 1C may be defined as the display surface DP-IS of the display apparatus EA.

The normal direction of the display surface DP-IS, which is, the thickness direction of the display apparatus EA is indicated by a third direction DR3. A front surface (or upper surface) and a rear surface (or lower surface) of each of layers or units to be described below are defined based on the third direction DR3.

The display apparatus EA may include a display region DA and a non-display region NDA. The display region DA may be defined as a region in which the light generated by the pixel PX is provided. The non-display region NDA is defined along the edge of the display surface DP-IS. The non-display region NDA may surround the display region DA. In an embodiment, the non-display region NDA may be omitted or may be disposed only on one side of the display region DA.

The display apparatus EA having a flat display surface DP-IS is illustrated as an embodiment, but is not limited thereto. The display apparatus EA may include a curved display surface or a three-dimensional display surface. The three-dimensional display surface may include multiple display regions indicating different directions.

For example, referring to FIG. 1B, the display apparatus EA according to an embodiment may be curved along the first direction DR1 with respect to a virtual axis AX extending in the second direction DR2. However, the disclosure is not limited thereto, and the axis may extend in the first direction DR1 or may be curved with respect to multiple axes extending in different directions.

The external appearance of the display apparatus EA according to an embodiment may be defined by the combination of a window WD and a case CS. The case CS according to an embodiment may be provided as a separate component or may be defined by a metal-containing layer disposed under the display panel DP. This will be described later.

The front surface of the window WD may provide the display surface DP-IS of the display apparatus EA. The window WD may include an optically transparent insulating material. For example, the window WD may include glass or plastic. The window WD may have a multilayer structure or a single-layer structure. For example, the window WD may include multiple plastic films bonded with an adhesive, or may include a glass substrate and a plastic film bonded with an adhesive.

Referring to FIG. 1C, the display apparatus EA according to an embodiment may include a thermal spreading sheet HL, a display panel DP disposed on the thermal spreading sheet HL, and a window WD.

The display panel DP may include a base layer BS, a circuit device layer DP-CL disposed on the base layer BS, a display device layer DP-OLED disposed on the circuit device layer DP-CL, and a light control layer OSL disposed on the display device layer DP-OLED.

The base layer BS may be a basis layer on which components included in the pixel PX are disposed. The base layer BS may be a flexible or rigid substrate.

The circuit device layer DP-CL may be disposed on the base layer BS. The circuit device layer DP-CL may include a driving circuit or a signal line for the pixel PX.

The display device layer DP-OLED may be disposed on the circuit device layer DP-CL. The display device layer DP-OLED may include a light-emitting device disposed in each pixel PX and an encapsulation layer that seals the light-emitting device.

The light control layer OSL may be disposed on the display device layer DP-OLED. The light control layer OSL may include light control patterns capable of changing the optical properties of source light provided from the light-emitting device. The light control patterns may include quantum dots.

Referring to FIG. 1D, the display panel DP may include signal lines GL1 to GLn, DL1 to DLm, PL-G, and PL-D, and pixels PX11 to PXnm. The signal lines GL1 to GLn, DL1 to DLm, PL-G, and PL-D may include multiple gate lines GL1 to GLn, multiple data lines DL1 to DLm, and auxiliary signal lines PL-G and PL-D.

The gate lines GL1 to GLn may extend in the first direction DR1 and may be arranged in the second direction DR2, and the multiple data lines DL1 to DLm and the multiple gate lines GL1 to GLn may be mutually insulated and may cross each other. The gate lines GL1 to GLn and the data lines DL1 to DLm may be disposed to overlap the display region DA. The auxiliary signal lines PL-G and PL-D may be disposed to overlap the non-display region NDA, and the auxiliary signal lines PL-G and PL-D may be electrically connected to the corresponding gate lines GL1 to GLn and the corresponding data lines DL1 to DLm.

The second auxiliary signal lines PL-D connected to the data lines DL1 to DLm may be disposed on a layer different from a layer on which the multiple data lines DL1 to DLm are disposed. The data lines DL1 to DLm may be electrically connected to corresponding ones of the multiple second auxiliary signal lines PL-D through contact holes CH. The contact holes CH may pass through at least one insulating layer disposed between the data lines DL1 to DLm and the second auxiliary signal lines PL-D. In FIG. 1D, two contact holes CH are illustrated as an example.

In an embodiment, the contact holes CH may be omitted. The data lines DL1 to DLm and the second auxiliary signal lines PL-D may be disposed on the same layer. Among the data lines DL1 to DLm and the second auxiliary signal lines PL-D, a data line and a second auxiliary signal line connected to each other may define one signal line. The data line and the second auxiliary signal line connected to each other may be defined as different portions of the one signal line.

The display region DA may be defined as a region in which light generated from the pixels PX11 to PXnm is provided. The non-display region NDA may surround the display region DA. Each of the pixels PX11 to PXnm may be connected to a corresponding ones of the multiple gate lines GL1 to GLn and a corresponding ones of the multiple data lines DL1 to DLm. Each of the pixels PX11 to PXnm may include a pixel driving circuit and a display device.

FIG. 1D illustrates the pixels PX11 to PXnm in a matrix form, but the disclosure is not limited thereto. The pixels PX11 to PXnm may be arranged in a diamond form, or the arrangement of the pixels PX11 to PXnm may be a Pen-Tile™ structure.

A gate driving circuit GDC may be integrated in the display panel DP through an oxide silicon gate driver circuit (OSG) process or an amorphous silicon gate driver circuit (ASG) process. First auxiliary signal lines PL-G each receive a gate signal from the gate driving circuit GDC.

A main circuit board MPCB may be disposed apart from an edge E-DP of the display panel DP. A signal control unit SC may be mounted on the main circuit board MPCB. The signal control unit SC may receive image data and a control signal from an external graphic control unit (not shown). The signal control unit SC may provide a control signal to the display panel DP.

A flexible circuit board FPCB may electrically connect the display panel DP and the main circuit board MPCB. The flexible circuit board FPCB may include flexible pads, each of which may be connected to the display pads of the display panel DP. The flexible circuit board FPCB may also include flexible pads, each of which may be connected to the main pads of the main circuit board MPCB. The connection between the pads may be achieved by a conductive adhesive member. The conductive adhesive member may include an anisotropic conductive film (ACF).

The flexible circuit board FPCB may include a driving chip DC. The driving chip DC may be mounted on the flexible circuit board FPCB. The driving chip DC may receive a signal from the main circuit board MPCB, and the display panel DP may receive a signal from the driving chip DC. In this embodiment, each of the driving chips DC may be a data driving circuit. In an embodiment, the flexible circuit board FPCB may transmit a signal provided from the signal control unit SC to the display panel DP.

In this embodiment, the flexible circuit board FPCB may be provided in plural. For example, the flexible circuit boards may be disposed apart from each other in the first direction DR1. However, the disclosure is not limited thereto, and the flexible circuit boards FPCB may include two types of flexible circuit boards at least partially overlapping each other.

In this embodiment, the flexible circuit board FPCB may have a predetermined curvature and may bend in a direction toward a rear surface of the display panel DP. The main circuit board MPCB may be disposed on the rear surface of the display panel DP. Accordingly, the rear surface of the main circuit board MPCB may face the rear surface of the display panel DP.

FIG. 2 is a schematic cross-sectional view of the display panel DP corresponding to one pixel PX. The display region DA includes a light-emitting region PXA and a non-light-emitting region NPXA. The light-emitting region PXA may correspond to a region to which light generated from the pixels PX is supplied. The non-light-emitting region NPXA may set a boundary between multiple light-emitting regions PXA and may prevent color mixing between the light-emitting regions PXA. In this embodiment, the light-emitting region PXA is defined to correspond to a second opening OP2 to be described later. The non-light-emitting region NPXA is defined as a region in which a partition wall BW is disposed.

The multiple light-emitting regions PXA may include a first light-emitting region that provides first color light (e.g., red light), a second light-emitting region that provides second color light (e.g., green light), and a third light-emitting region that provides third color light (e.g., blue light). The main three colors may be changed into other combinations, and are not particularly limited. The light-emitting region PXA of FIG. 2 is described as a first light-emitting region that may provide red light.

Since the cross-sectional structures of the first light-emitting region, the second light-emitting region, and the third light-emitting region may be substantially the same, the first light-emitting region will be mainly described. The differences between the first light-emitting region, the second light-emitting region, and the third light-emitting region are specified below, and components other than the specified component may be considered to be identical.

Areas of the first light-emitting region, the second light-emitting region, and the third light-emitting region may be same as or different from each other, and are not particularly limited. The first light-emitting region, the second light-emitting region, and the third light-emitting region may be arranged in any one of a stripe form, a matrix form, or a Pen-Tile™ form, but are not particularly limited.

The display panel DP may include multiple insulating layers, a semiconductor pattern, a conductive pattern, a signal line, etc. An insulating layer, a semiconductor layer, and a conductive layer may be formed through a process such as coating and/or deposition. Thereafter, the insulating layer, the semiconductor layer, and the conductive layer may be selectively patterned through photolithography and/or etching processes. In this way, semiconductor patterns, conductive patterns, and signal lines included in the circuit device layer DP-CL and the display device layer DP-OLED may be formed.

The circuit device layer DP-CL may be disposed on the base layer BS. The circuit device layer DP-CL may include a buffer film BFL, a first insulating layer 10, a second insulating layer 20, and a third insulating layer 30. For example, the buffer layer BFL, the first insulating layer 10, and the second insulating layer 20 may be an inorganic layer, and the third insulating layer 30 may be an organic layer.

In an embodiment of FIG. 2, illustrated is an arrangement of an active A-D, a source S-D, a drain D-D, and a gate G-D, which may constitute a driving transistor T-D. The active A-D, the source S-D, and the drain D-D may be regions divided according to the doping concentration or conductivity of the semiconductor pattern.

The display device layer DP-OLED may include a light-emitting device OLED. The light-emitting device OLED may generate source light. In this embodiment, the display device layer DP-OLED may include an organic light-emitting diode as a light-emitting device. The display device layer DP-OLED may include a pixel defining film PDL. For example, the pixel defining film PDL may be an organic layer. The pixel defining film PDL may include a typical black coloring agent. The pixel defining film PDL may include a black dye and a black pigment mixed with a base resin. In an embodiment, the black coloring agent may include carbon black, a metal such as chromium, or an oxide thereof.

A first electrode AE may be disposed on the third insulating layer 30. The first electrode AE may be directly or indirectly connected to the driving transistor T-D. In FIG. 2, a connection structure between the first electrode AE and the driving transistor T-D is not illustrated. A first opening OP1 is defined in the pixel defining film PDL. The first opening OP1 may expose at least a portion of the first electrode AE.

A hole control layer HCL, a light-emitting layer EML, and an electron control layer ECL may be disposed in both the light-emitting region PXA and the non-light-emitting region NPXA. The hole control layer HCL, the light-emitting layer EML, and the electron control layer ECL may be disposed in the multiple light-emitting regions. The light-emitting layer EML of each of the multiple light-emitting regions may have an integral shape. The light-emitting layer of the first light-emitting region, the light-emitting layer of the second light-emitting region, and the light-emitting layer of the third light-emitting region may have an integral shape, and the light-emitting layer may generate source light of the same color regardless of the region. The hole control layer HCL may include a hole transport layer and may further include a hole injection layer.

In the disclosure, the light-emitting layer EML may generate blue light as source light. Blue light may include a wavelength of about 410 nm to about 480 nm. An emission spectrum of blue light may have a peak wavelength in the range of about 440 nm to about 460 nm.

The electron control layer ECL may include an electron transport layer and may further include an electron injection layer. The second electrode CE is disposed on the electronic control layer ECL. The second electrode CE may be disposed in the multiple light-emitting regions. The multiple light-emitting regions may include the second electrode CE having an integral shape.

A first encapsulation layer TFE1 that may seal the light-emitting device OLED may be disposed on the second electrode CE. The first encapsulation layer TFE1 may include at least one inorganic layer. The first encapsulation layer TFE1 may have a multilayer structure in which an inorganic layer and an organic layer are alternately stacked each other.

In this embodiment, the first encapsulation layer TFE1 may include a first inorganic encapsulation layer IOL1, an organic encapsulation layer OL, and a second inorganic encapsulation layer IOL2. The first and second inorganic encapsulation layers IOL1/IOL2 may protect the light-emitting device OLED from external moisture, and the organic encapsulation layer OL may prevent dent defects on the light-emitting device OLED caused by foreign substances introduced during the manufacturing process. Although not illustrated, the display panel DP may further include, on the first encapsulation layer TFE1, a refractive index control layer for improving light output efficiency.

The light control layer OSL may be disposed on the first encapsulation layer TFE1. The light control layer OSL may include the partition wall BW, a light control pattern CCF-R, a second encapsulation layer TFE2, a color filter CF-R, and a protective layer OC.

The partition wall BW may be disposed on the first encapsulation layer TFE1. The partition wall BW may include a base resin having a high light transmittance and an additive. The base resin may be composed of various resin compositions, which may be generally referred to as binders. The additive may include a coupling agent and/or a photoinitiator. The additive may further include a dispersant.

The partition wall BW may include a black coloring agent to block light. The partition wall BW may include a black dye and a black pigment mixed with a base resin. In an embodiment, the black coloring agent may include carbon black, a metal such as chromium, or an oxide thereof.

The partition wall BW may include a second opening OP2 corresponding to the first opening OP1. In a plan view, the second opening OP2 may overlap the first opening OP1 and may have a larger area than the first opening OP1.

The light control pattern CCF-R may be disposed inside of the second opening OP2. The light control pattern CCF-R may change the optical properties of the source light. The light control pattern CCF-R of the first light-emitting region and the second light-emitting region may be color conversion patterns capable of converting the color of the source light. For example, the color conversion pattern of the first light-emitting region may convert the source light from blue light to red light, and the color conversion pattern of the second light-emitting region may convert the source light from blue light to green light.

The light control pattern CCF-R of the third light-emitting region may be a transmission pattern. The light control pattern CCF-R of the third light-emitting region may scatter and then emit the received blue light including scattering particles. The light control pattern CCF-R may improve the luminance of the emitted light compared to the incident light.

The color conversion pattern may include a base resin and quantum dots mixed (or dispersed) in the base resin. In this embodiment, the color conversion pattern may include quantum dots, and thus, may be defined as a quantum dot pattern, and the color conversion patterns of the first light-emitting region and the second light-emitting region may include different quantum dots. The base resin is a medium in which quantum dots are dispersed, and may be composed of various resin compositions that may be generally referred to as binders. However, the disclosure is not limited thereto, and in the disclosure, as long as being capable of dispersing quantum dots, a medium may be referred to as a base resin regardless of its name, additional functions, constituent materials, and the like. The base resin may be a polymer resin. For example, the base resin may be an acrylic resin, a urethane-based resin, a silicone-based resin, an epoxy-based resin, and the like. The base resin may be a transparent resin.

The color conversion pattern may further include scattering particles mixed with the base resin as the above-described transmission pattern. The scattering particles may be titanium oxide (TiO2) or silica-based nanoparticles.

The quantum dots may be particles that may convert the wavelength of incident light. Quantum dots are substances having a crystal structure of several nanometers in size, composed of hundreds to thousands of atoms, and exhibit a quantum confinement effect of increasing the energy band gap due to having a small size. When light of a wavelength higher than the band gap is incident on the quantum dots, the quantum dots absorb the light to become exited, and then return to the ground state while emitting light of a specific wavelength. The energy of the emitted light has a value corresponding to the band gap. By controlling the size and composition of quantum dots, the luminescence characteristics of the quantum confinement effect may be controlled.

The quantum dots may be selected from the group consisting of a group II-VI compound, a group compound, a group III-V compound, a group IV-VI compound, a group IV element, a group IV compound, and combinations thereof.

The group II-VI compound may be selected from the group consisting of: a binary compound selected from the group consisting of CdSe, CdTe, CdS, ZnS, ZnSe, ZnTe, ZnO, HgS, HgSe, HgTe, MgSe, MgS, and a mixture thereof; a ternary compound selected from the group consisting of AgInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group compound may be selected from a ternary compound selected from the group consisting of AgInS2, CuInS2, AgGaS2, CuGaS2, and a mixture thereof, or a quaternary compound such as AgInGaS2 and CuInGaS2.

The group III-V compound may be selected from the group consisting of: a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The group III-V compound may further include a group II metal. For example, InZnP or the like may be selected as the group III-II-V compound.

The group IV-VI compound may be selected from the group consisting of: a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. The group IV element may be selected from the group consisting of Si, Ge, and a mixture thereof. The group IV compound may be a binary compound selected from the group consisting of SiC, SiGe, and a mixture thereof.

The binary compound, the ternary compound, or the quaternary compound may be present in the particle with a uniform concentration, or may be present in the same particle with partially different concentration distributions.

The quantum dots may have a core-shell structure including a core and a shell surrounding the core. A core/shell structure in which one quantum dot surrounds another quantum dot may also be possible. An interface between the core and the shell has a concentration gradient in which the concentration of elements in the shell decreases toward the core.

The quantum dots may be particles having a size of a nanometer scale. The quantum dots may have, in an emission wavelength spectrum, a full width of half maximum (FWHM) of about 45 nm or less in an embodiment, about 40 nm or less in another embodiment, or about 30 nm or less in another embodiment. In this range, the color purity or color reproducibility may be improved. Light emitted through the quantum dots is emitted in all directions, so that a wide viewing angle characteristic may be improved.

The shape of the quantum dot QD is not particularly limited to a shape commonly used in the field, but the quantum dot may have a shape such as a spherical shape, a pyramidal shape, a multi-arm shape, a cubic nanoparticle, a nanotube, a nanowire, a nanofiber, or a nanoplatelet particle. The quantum dot may control the color of the emitted light according to the particle size, and accordingly, the quantum dot may have various emission colors such as red light, green light, and blue light.

In this embodiment, the light control pattern CCF-R may be formed through an inkjet process. A liquid composition may be provided in the second opening OP2. The composition after a thermal curing process or a light curing process may be reduced in volume after curing.

The second encapsulation layer TFE2 overlapping the light control pattern CCF-R may be disposed on the partition wall BW. The second encapsulation layer TFE2 may include a first inorganic encapsulation layer IOL10, an organic encapsulation layer OL-1, and a second inorganic encapsulation layer IOL20. The first and second inorganic encapsulation layers IOL10 and IOL20 may protect the light control pattern CCF-R from external moisture. The organic encapsulation layer OL-1 may remove steps defined by the partition wall BW and the light control pattern CCF-R, and may provide a flat base surface to a member to be disposed thereon.

Each of the first inorganic encapsulation layer IOL10 and the second inorganic encapsulation layer IOL20 may include at least one of silicon oxide, silicon oxynitride, and silicon nitride. The organic encapsulation layer OL-1 may include an organic material, for example, an acrylic organic material.

The color filter CF-R may be disposed on the second encapsulation layer TFE2. The color filter CF-R may transmit light within a specific wavelength range and may block light outside the specific wavelength range. The color filter CF-R of the first light-emitting region may transmit red light and block green light and blue light.

The color filter CF-R may include a base resin and a dye and/or pigment dispersed in the base resin. The base resin may be a medium in which the dye and/or pigment are dispersed, and may be composed of various resin compositions, which may be generally referred to as binders.

The color filter CF-R disposed on a flat surface, which is formed by removing a step by the organic encapsulation layer OL-1, may have a uniform thickness in the light-emitting region PXA. The red light generated in the light control pattern CCF-R may be provided to the outside with uniform luminance in the light-emitting region PXA.

The protective layer OC may be disposed on the color filter CF-R. The protective layer OC may be an organic layer that may protect the color filter CF-R. The protective layer OC may include a photo-curable organic material or a thermo-curable organic material.

According to an embodiment, a protective glass substrate may be further disposed on the protective layer OC. An adhesive layer may be disposed between the protective layer OC and the glass substrate. In an embodiment, the protective layer OC may include an inorganic material.

Figure 3:
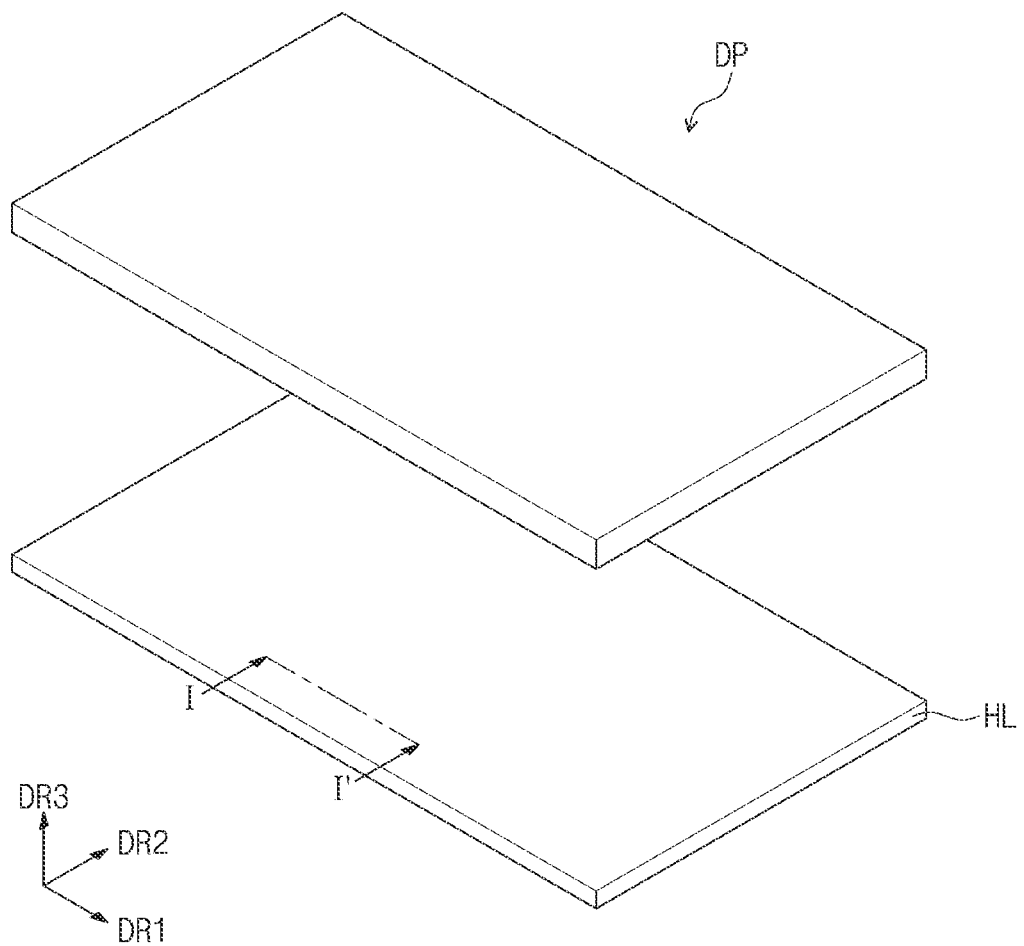
FIG. 3 is a perspective view illustrating an arrangement of a display panel and a thermal spreading sheet according to an embodiment.
Figure 4:
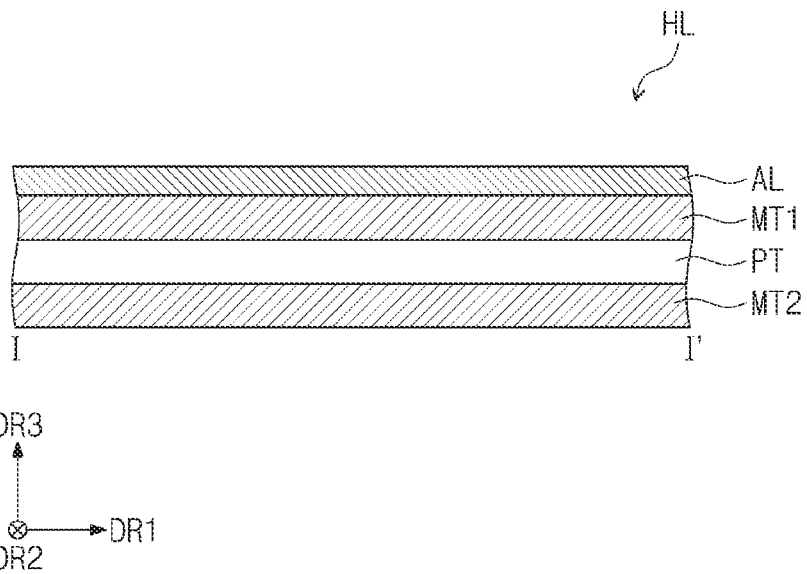
FIG. 4 is a schematic cross-sectional view taken along line I-I' of FIG. 3.

FIG. 3 is a perspective view illustrating an arrangement of a display panel and a thermal spreading sheet according to an embodiment. FIG. 4 is a schematic cross-sectional view taken along line I-I' of FIG. 3.

Referring to FIGS. 3 and 4, the thermal spreading sheet HL according to an embodiment may be disposed under the display panel DP. The thermal spreading sheet HL may function to emit, to the outside of the display panel DP, heat generated when the light-emitting device OLED is in operation.

In general, according to the slimming trend of the display apparatus EA, the thickness of the thermal spreading sheet HL also becomes thinner, resulting in a decrease of thermal resistance value in the third direction DR3, for example, the thickness direction of thermal spreading sheet HL. Accordingly, the thermal spreading sheet HL facilitates heat transfer in the third direction DR3, and has reduced heat transfer efficiency in the plane direction of the first direction DR1 and the second direction DR2.

For example, when light is provided only in a part of the light-emitting region PXA, heat is transferred only in the third direction DR3 in the region of the thermal spreading sheet HL overlapping the light-emitting region PXA, and thus only the temperature of the region overlapping the light-emitting region PXA may increase.

Therefore, to ensure the thermal spreading characteristics of the thermal spreading sheet HL which is slimmed according to the slimming trend of the display apparatus EA, heat transfer characteristics in the plane direction, for example, in the first direction DR1 and the second direction DR2 may be further improved as the thermal resistance in the planar direction becomes lower than the thermal resistance in the thickness direction of the thermal spreading sheet HL.

Since the thermal spreading sheet HL according to an embodiment may include multiple layers having different thermal resistances in different horizontal and vertical directions, heat transfer characteristics in the plane direction may be improved in the layer having relatively high thermal conductivity. A detailed description will be made later.

Referring to FIG. 4, the thermal spreading sheet HL according to an embodiment may include an adhesive layer AL, a first layer MT1, a second layer PT, and a third layer MP2. The adhesive layer AL may contact the rear surface of the display panel DP to couple the remaining layers to the display panel DP.

The adhesive layer AL may include at least one of an optically clear adhesive, an optically clear adhesive resin, and a pressure sensitive adhesive (PSA). The adhesive layer AL may have a thickness of about 50 um or less.

In this embodiment, the adhesive layer AL may include a light-shielding material. The light-shielding material constituting the adhesive layer AL is not limited to any specific one. The adhesive layer AL may have a predetermined color. For example, the adhesive layer AL may have a black color.

As the adhesive layer AL may block light provided to the inside of the display panel DP from the outside and have a predetermined color, it is possible to prevent a defect that components disposed on the base layer BS are visible to a user.

The first layer MT1 may be disposed between the adhesive layer AL and the second layer PT. The second layer PT may be disposed between the first layer MT1 and the third layer MT2. The third layer MT2 may be disposed apart from the first layer MT1 with the second layer PT therebetween.

In an embodiment, the first layer MT1 and the third layer MT2 may have relatively higher thermal conductivity than the second layer PT. Accordingly, the first layer MT1 and the third layer MT2 may be high thermal conductivity layers, and the second layer PT may be provided as a relatively low thermal conductivity layer.

In order for the thermal spreading sheet HL disposed under the display panel DP to efficiently emit heat, the first layer MT1 and the third layer MT2 may need to include a material having a high thermal conductivity and to have low thermal resistance in the plane direction. The second layer PT may include a material having low thermal conductivity, and the heat resistance of the second layer PT in the thickness direction may need to be high in order to diffuse heat in the plane direction in the first layer MT1 and the third layer MT2.

The first layer MT1 and the third layer MT2 according to an embodiment may each have a thermal conductivity of about 100 W/mK to about 500 W/mK, and the second layer PT may have a thermal conductivity of about 0.1 W/mK to about 0.5 W/mK.

According to an embodiment, each of the first layer MT1 and the third layer MT2 may include a metal. For example, each of the first layer MT1 and the third layer MT2 may include at least one of silver, copper, gold, silicon carbide, and aluminum.

The second layer PT may include a polymer-based material. For example, the second layer PT may include any one of polyethylene, polyester, or polyethylene terephthalate.

The first layer MT1 and the third layer MT2 may each have a horizontal thermal resistance value of about 1 K/J to about 20 K/J. In case that the first layer MT1 and the third layer MT2 each have a horizontal thermal resistance value of less than about 1K/J, the anisotropic heat conduction characteristic may be lost, and heat that is transferred to the first layer MT1 and the third layer MT2 may be transferred in the thickness direction before being diffused in the plane direction, so that the heat may be generated only in a local region of the thermal spreading sheet HL. When the first layer MT1 and the third layer MT2 each have a horizontal thermal resistance of exceeds about 20 K/J, the rate of thermal diffusion in the plane direction may decrease, so that the heat may be generated only in a local region of the thermal spreading sheet HL.

The second layer PT according to an embodiment may have the vertical thermal resistance value of about 500 K/J to about 2000 K/J. In case that the second layer PT has a vertical thermal resistance value of less than about 500K/J, heat provided from the light-emitting device OLED may be easily transferred in the thickness direction of the second layer PT, so that the time for diffusion of the heat provided to the first layer MT1 and the third layer MT2 to be diffused in the plane direction may be reduced. When the vertical thermal resistance value of the second layer PT exceeds 2000K/J, heat provided from the light-emitting device OLED may not be transferred to the third layer MT2 through the second layer PT.

In an embodiment, the thermal resistance value of each of the first to third layers MT1, PT and MT2 may be determined by Equation 1 below.

Rt=L/kA

Here, 'A' is the area of a layer perpendicular to the heat propagation direction, 'L' is the heat travel distance, and 'k' is the thermal conductivity.

Hereinafter, with reference to Tables 1 and 2, thermal resistance values according to materials and thicknesses included in the first to third layers MT1, PT, and MT2 will be investigated.

Table 1 shows data on the vertical thermal resistance of the second layer PT when the thermal conductivity of a polymer-based material included in the second layer PT has a value in the range of about 0.1 to about 0.5, and Table 2 shows data on horizontal thermal resistance according to respective metal materials included in the first and third layers MT1 and MT2.

TABLE 1

Vertical thermal resistance of low thermal conductivity layer

| Thickness | Thermal conductivity W/(mK) | | | | |
|---|---|---|---|---|---|
| (m) | 0.1 | 0.2 | 0.3 | 0.4 | 0.5 |
| 0.00005 | 5.00E+02 | 2.50E+02 | 1.67E+02 | 1.25E+02 | 1.00E+02 |
| 0.0001 | 1.00E+03 | 5.00E+02 | 3.33E+02 | 2.50E+02 | 2.00E+02 |
| 0.0002 | 2.00E+03 | 1.00E+03 | 6.67E+02 | 5.00E+02 | 4.00E+02 |
| 0.0003 | 3.00E+03 | 1.50E+03 | 1.00E+03 | 7.50E+02 | 6.00E+02 |
| 0.0004 | 4.00E+03 | 2.00E+03 | 1.33E+03 | 1.00E+03 | 8.00E+02 |
| 0.0005 | 5.00E+03 | 2.50E+03 | 1.67E+03 | 1.25E+03 | 1.00E+03 |
| 0.0006 | 6.00E+03 | 3.00E+03 | 2.00E+03 | 1.50E+03 | 1.20E+03 |
| 0.0007 | 7.00E+03 | 3.50E+03 | 2.33E+03 | 1.75E+03 | 1.40E+03 |
| 0.0008 | 8.00E+03 | 4.00E+03 | 2.67E+03 | 2.00E+03 | 1.60E+03 |
| 0.0009 | 9.00E+03 | 4.50E+03 | 3.00E+03 | 2.25E+03 | 1.80E+03 |
| 0.001 | 1.00E+04 | 5.00E+03 | 3.33E+03 | 2.50E+03 | 2.00E+03 |

TABLE 2

Horizontal thermal resistance of high thermal conductivity layer

| | Thermal conductivity W/(mK) | | | | |
|---|---|---|---|---|---|
| Thickness (m) | Silver (429) | Copper (398) | Gold (315) | Silicon carbide (270) | Aluminum (237) |
| 0.00005 | 46.62 | 50.25 | 63.49 | 74.07 | 84.39 |
| 0.0001 | 23.31 | 25.13 | 31.75 | 37.04 | 42.19 |
| 0.00015 | 15.54 | 16.75 | 21.16 | 24.69 | 28.13 |
| 0.0002 | 11.66 | 12.56 | 15.87 | 18.52 | 21.10 |
| 0.00025 | 9.32 | 10.05 | 12.70 | 14.81 | 16.88 |
| 0.0003 | 7.77 | 8.38 | 10.58 | 12.35 | 14.06 |
| 0.0004 | 5.83 | 6.28 | 7.94 | 9.26 | 10.55 |
| 0.0005 | 4.66 | 5.03 | 6.35 | 7.41 | 8.44 |
| 0.001 | 2.33 | 2.51 | 3.17 | 3.70 | 4.22 |
| 0.002 | 1.17 | 1.26 | 1.59 | 1.85 | 2.11 |

The second layer PT, for example, the low thermal conductivity layer, according to an embodiment may have a vertical thermal resistance value of about 500 K/J to about 2000 K/J. Accordingly, the thickness of the second layer PT according to the material included in the second layer PT may be as follows.

In case that a thermal conductivity of the second layer PT is 0.1, the second layer PT may have a thickness of about 0.00005 m to about 0.0002 m. In case that the thermal conductivity of the second layer PT is about 0.2, the second layer PT may have a thickness of about 0.0001 m to about 0.0004 m. In case that the thermal conductivity of the second layer PT is about 0.3, the second layer PT may have a thickness of about 0.0002 m to about 0.0006 m. In case that the thermal conductivity of the second layer PT is about 0.4, the second layer PT may have a thickness of about 0.0002 m to about 0.0007 m. In case that the thermal conductivity of the second layer PT is about 0.5, the second layer PT may have a thickness of about 0.0003 m to about 0.001 m.

The first layer MT1 and the third layer MT2, for example, a high thermal conductivity layer, according to an embodiment each may have a horizontal thermal resistance value of about 1 K/J to about 20 K/J. Accordingly, the thicknesses of the first and third layers MT1 and MT2 according to materials included in the first and third layers MT1 and MT2 may be as follows.

In case that the first and third layers MT1 and MT2 each include 'silver', the first and third layers MT1 and MT2 may each have a thickness of about 0.00015 m to about 0.002 m. In case that the first and third layers MT1 and MT2 each include 'copper', the first and third layers MT1 and MT2 may each have a thickness of about 0.00015 m to about 0.002 m. In case that the first and third layers MT1 and MT2 each include 'gold', the first and third layers MT1 and MT2 may each have a thickness of about 0.0002 m to about 0.002 m. In case that the first and third layers MT1 and MT2 each include ' silicon carbide', the first and third layers MT1 and MT2 may each have a thickness of about 0.00015 m to about 0.002 m. In case that the first and third layers MT1 and MT2 each include 'aluminum', the first and third layers MT1 and MT2 may each have a thickness of about 0.00025 m to about 0.002 m.

The first and third layers MT1 and MT2 may each have a thickness range of about 0.15 mm to about 2 mm depending on the material, and the second layer PT may have a thickness of about 0.05 mm to about 1 mm depending on the material. In an embodiment, the total thickness of the thermal spreading sheet HL may be about 0.5 mm or more.

According to an embodiment, since the thermal spreading sheet HL including the second layer PT having a relatively low thermal conductivity may be included between the first and third layers MT1 and MT2 which have high thermal conductivity, the heat generated by the light-emitting device OLED may be easily diffused and emitted from the thermal spreading sheet HL in the plane direction. Accordingly, it is possible to provide a display apparatus EA in which the lifespan of the light-emitting device OLED is improved and an afterimage on the display surface DP-IS is reduced.

Figure 5:
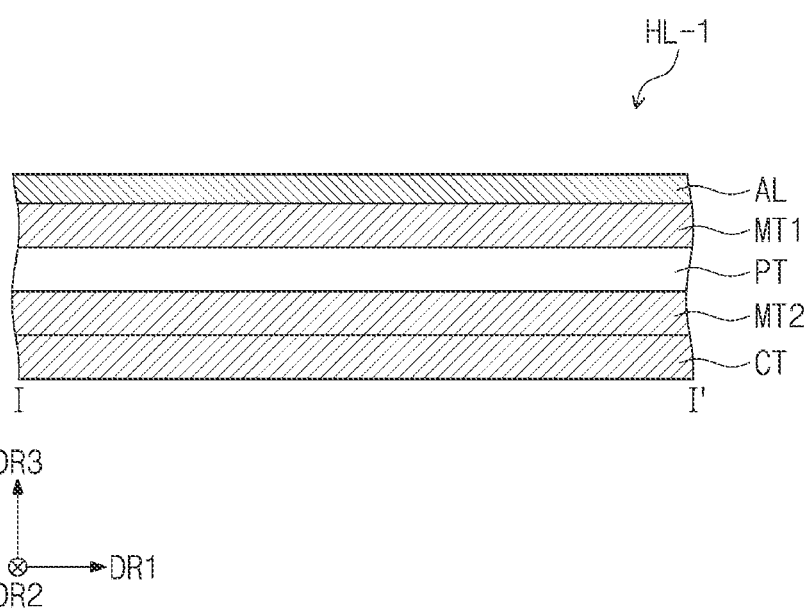
FIG. 5 is a schematic cross-sectional view of a thermal spreading sheet according to an embodiment.
Figure 6:
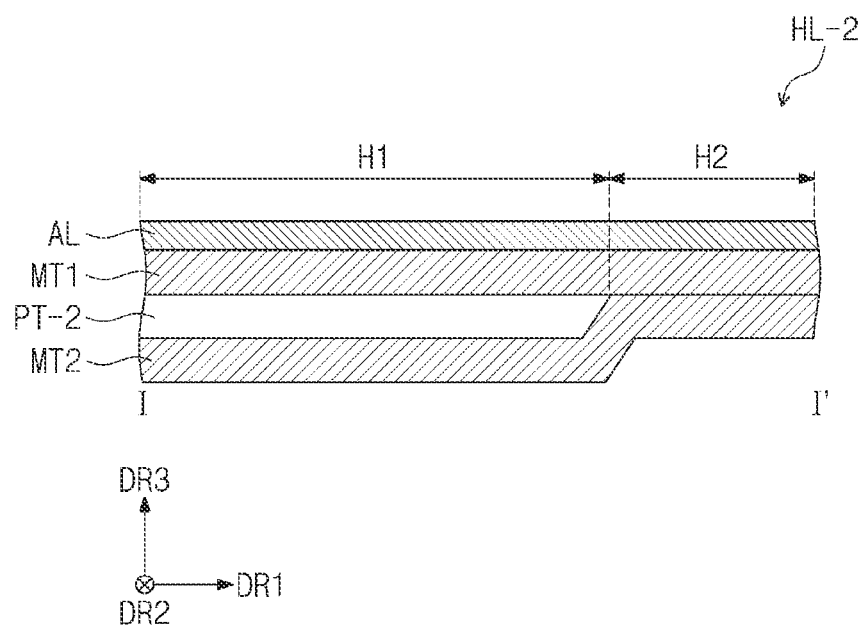
FIG. 6 is a schematic cross-sectional view of a thermal spreading sheet according to an embodiment.
Figure 7:
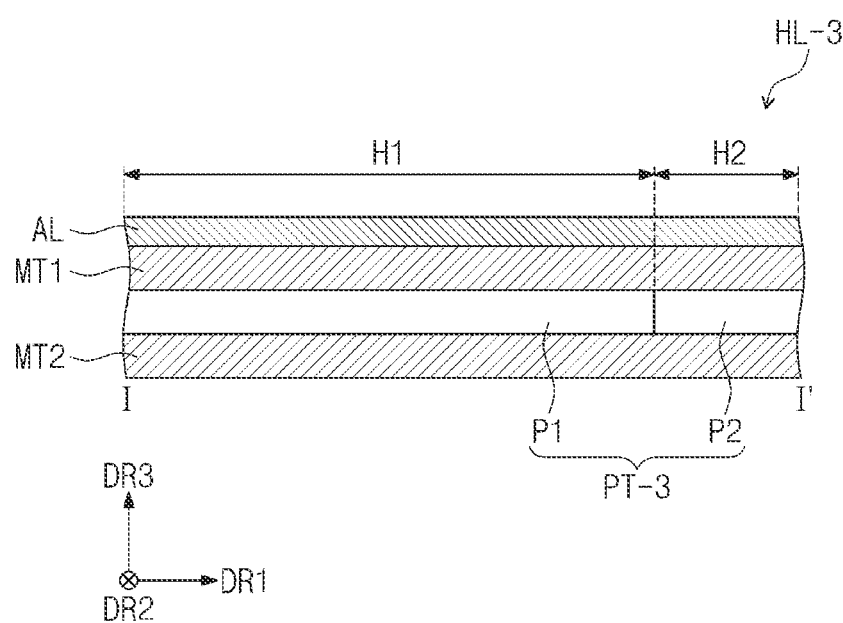
FIG. 7 is a schematic cross-sectional view of a thermal spreading sheet according to an embodiment.
Figure 8:
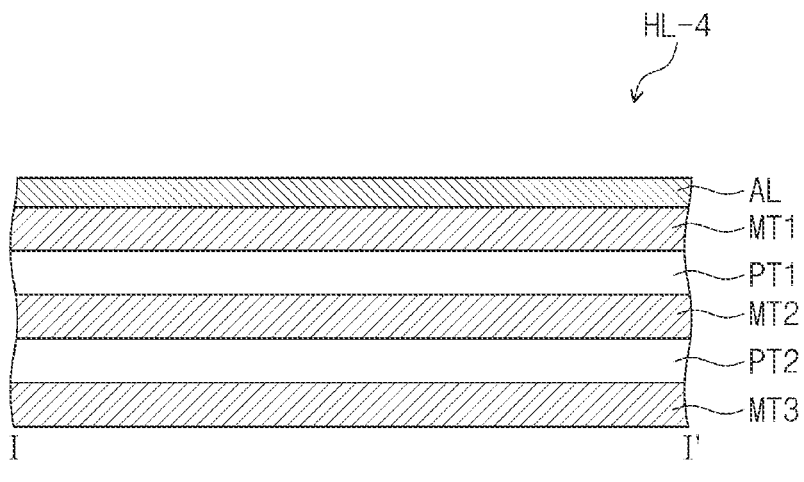
FIG. 8 is a schematic cross-sectional view of a thermal spreading sheet according to an embodiment.
Figure 8:
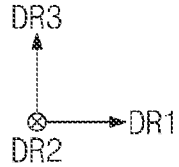
Figure 9:
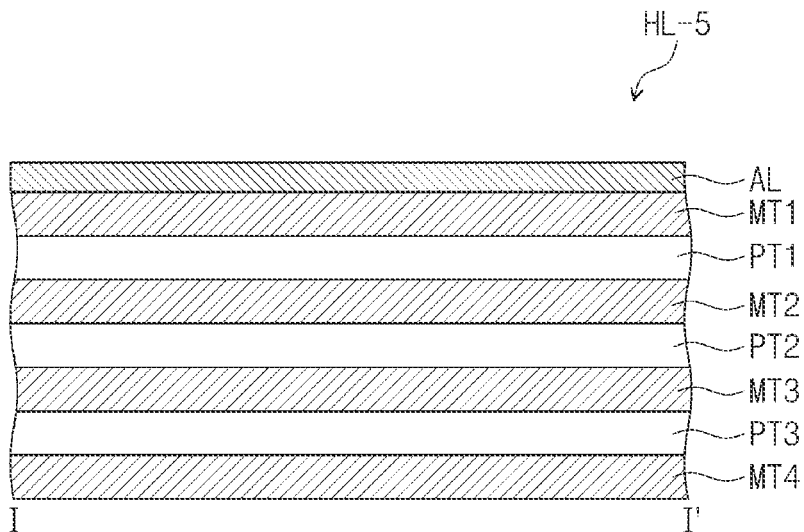
FIG. 9 is a schematic cross-sectional view of a thermal spreading sheet according to an embodiment.
Figure 9:
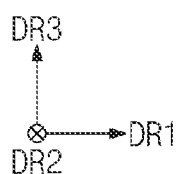

FIG. 5 is a schematic cross-sectional view of a thermal spreading sheet according to an embodiment. FIG. 6 is a schematic cross-sectional view of a thermal spreading sheet according to an embodiment. FIG. 7 is a schematic cross-sectional view of a thermal spreading sheet according to an embodiment. FIG. 8 is a schematic cross-sectional view of a thermal spreading sheet according to an embodiment. FIG. 9 is a schematic cross-sectional view of a thermal spreading sheet according to an embodiment.

The same/similar reference numerals or symbols are given to the same/similar components as those described with reference to FIGS. 1A to 4, and duplicated descriptions will be omitted herein. Limitations on materials, thicknesses, and thermal resistances of a low-conductivity layer and a high-conductivity layer to be described with reference to FIGS. 5 to 9 may be the same as the materials, the thicknesses, and the thermal resistances of the low-conductivity layer and the high-conductivity layer which have been described with reference to FIGS. 1A to 4.

Referring to FIG. 5, the thermal spreading sheet HL-1 according to an embodiment may include the adhesive layer AL, the first layer MT1, the second layer PT, the third layer MT2, and the coating layer CT.

The adhesive layer AL may contact the rear surface of the display panel DP (see FIG. 1C). The first layer MT1 may be disposed between the adhesive layer AL and the second layer PT. The second layer PT may be disposed between the first layer MT1 and the third layer MT2. The third layer MT2 may be disposed between the second layer PT and the coating layer CT. The coating layer CT may be disposed apart from the second layer PT with the third layer MT2 therebetween.

The coating layer CT according to an embodiment may be disposed at the outermost section of the display apparatus EA. In this embodiment, the third layer MT2 may correspond to the case CS described with reference to FIG. 1A. Accordingly, the window WD (see FIG. 1C) and the third layer MT2 may be coupled to each other to define the external appearance of the display apparatus EA (see to FIG. 1A). The coating layer CT may cover the third layer MT2, and thus may be a functional layer for preventing scratches or dents on the third layer. The coating layer CT may be formed on the third layer MT2 through painting.

In this embodiment, the coating layer CT may have an emissivity of about 0.9 or more. Accordingly, the coating layer CT may allow the heat diffused in the plane direction of the third layer MT2 to be easily emitted, thereby enhancing heat radiation of the display panel DP.

In this embodiment, the coating layer CT may have a thickness of about 50 um or less.

According to this embodiment, since the outermost layer included in the thermal spreading sheet HL-1 may be formed as the exterior of the display apparatus EA, the display apparatus EA with reduced cost may be provided. Since the thermal spreading sheet may include the coating layer CT for preventing contamination of the third layer MT2 which may define the external appearance of display apparatus EA, the display apparatus EA with improved aesthetics may be provided.

Referring to FIG. 6, a thermal spreading sheet HL-2 according to an embodiment may include a first region H1 and a second region H2.

The first region H1 may be a region in which heat provided from the light-emitting device OLED (see FIG. 2) may spread anisotropically, and the second region H2 may be a region in which heat provided from the light-emitting device OLED (see FIG. 2) may spread isotropically.

According to this embodiment, the thermal spreading sheet HL-2 may include, in the first region H1, an adhesive layer AL, a first layer MT1, a second layer PT-2, and a third layer MT2 which may be stacked each other in this order from the rear surface of the display panel DP (see FIG. 1C), and the thermal spreading sheet HL-2 may include, in the second region H2, the adhesive layer AL, the first layer MT1, and the third layer MT2 which may be stacked each other in this order from the rear surface of the display panel DP (see FIG. 1C).

For example, according to this embodiment, the second layer PT-2 may be disposed only in the first region H1 and may not overlap the second region H2. The first layer MT1 and the third layer MT2 may contact each other in the second region H2.

Accordingly, in the first region H1, anisotropic thermal diffusion may occur in which heat provided from the light-emitting device OLED may be easily diffused in the plane direction in the first layer MT1 and the third layer MT2 through the second layer PT-2 which is disposed between the first layer MT1 and the third layer MT2. On the other hand, in the second region H2, isotropic thermal diffusion may occur because only the first layer MT1 and the third layer MT2, which include metal, may disposed in contact with each other.

According to an embodiment, the first region H1 may overlap the display region DA in FIG. 1A, and the second region H2 may overlap the non-display region NDA. However, the disclosure is not limited thereto, and the second region H2 may overlap at least a part of the display region DA.

Referring to FIG. 7, a thermal spreading sheet HL-3 according to an embodiment may include a first region H1 and a second region H2. The description of the first region H1 and the second region H2 may correspond to the first region H1 and the second region H2 in FIG. 6.

The thermal spreading sheet HL-3 according to an embodiment may include an adhesive layer AL, a first layer MT1, a second layer PT-3, and a third layer MT2. In this embodiment, the second layer PT-3 may include a first pattern P1 and a second pattern P2.

The first pattern P1 may overlap the first region H1. Accordingly, the thermal spreading sheet HL-3 may include, in the first region H1, the adhesive layer AL, the first layer MT1, the first pattern P1, and the third layer MT2 which may be stacked each other in this order from the rear surface of the display panel DP (see FIG. 1C). The thermal spreading sheet HL-3 may include, in the second region H2, the adhesive layer AL, the first layer MT1, the second pattern P2, and the third layer MT2 which may be stacked each other in this order from the rear surface of the display panel DP (see FIG. 1C). The first pattern P1 and second pattern P2 may have the same thickness.

According to this embodiment, the first pattern P1 may include a polymer-based material, and the second pattern P2 may include a metal. Accordingly, the thermal conductivity of the first pattern P1 may be lower than the thermal conductivity of the second pattern P2. The thermal conductivity of the second pattern P2 may be similar to the thermal conductivities of the first and third layers MT1 and MT2.

According to this embodiment, the first region H1 may be a region in which heat provided from the light-emitting device OLED (see FIG. 2) may spread anisotropically, and the second region H2 may be a region in which heat provided from the light-emitting device OLED (see FIG. 2) may spread isotropically. Since the second pattern P2 having the same thickness as the thickness of the first pattern P1 may be included in the second region H2, the third layer MT2 may be formed on the second layer PT-3 without a stepped portion. Accordingly, the display apparatus EA having improved surface quality may be provided.

Referring to FIG. 8, a thermal spreading sheet HL-4 according to an embodiment may include an adhesive layer AL, a first layer MT1, a second layer PT1, a third layer MT2, a fourth layer PT2 and a fifth layer MT3.

The first layer MT1, the third layer MT2, and the fifth layer MT3 may be high-conductivity layers including a metal. The second layer PT1 and the fourth layer PT2 each may include a polymer-based material and may have a lower conductivity than the first layer MT1, the third layer MT2, and the fifth layer MT3.

Referring to FIG. 9, a thermal spreading sheet HL-5 according to an embodiment may include an adhesive layer AL, a first layer MT1, a second layer PT1, a third layer MT2, a fourth layer PT2, a fifth layer MT3, a sixth layer PT3, and a seventh layer MT4.

The first layer MT1, the third layer MT2, the fifth layer MT3, and the seventh layer MT4 may be high-conductivity layers including a metal. The second layer PT1, the fourth layer PT2, and the sixth layer PT3 each may include a polymer-based material and may have a lower conductivity than the first layer MT1, the third layer MT2, and the fifth layer MT3.

Figure 10:
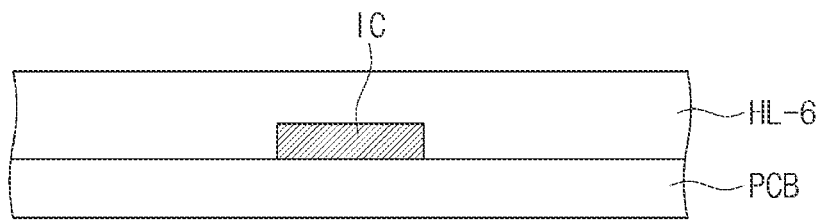
FIG. 10 is a schematic cross-sectional view of a circuit board and a thermal spreading sheet according to an embodiment.

FIG. 10 is a schematic cross-sectional view of a circuit board and a thermal spreading sheet according to an embodiment. The same/similar reference numerals or symbols are given to the same/similar components as those described with reference to FIGS. 1A to 4, and duplicated descriptions will be omitted.

The display apparatus EA (see FIG. 1D) according to an embodiment may further include another thermal spreading sheet HL-6. The another thermal spreading sheet HL-6 may be disposed on the circuit board PCB and may cover the heat generating element IC.

The another thermal spreading sheet HL-6 may have the same stacked structure as any one of the embodiments of the thermal spreading sheet described with reference to FIGS. 4 to 9.

A heat generating device IC mounted on the circuit board PCB may correspond to the driving chip DC that is mounted on the flexible circuit board FPCB described in FIG. 1D or may correspond to the signal control unit SC that is mounted on the main circuit board MPCB.

Accordingly, the another thermal spreading sheet HL-6 may be disposed on the flexible circuit board FPCB to cover the driving chip DC. The another thermal spreading sheet HL-6 may be disposed on the main circuit board MPCB to cover the signal control unit SC. Accordingly, heat generated by the driving chip DC or the signal control unit SC may be efficiently emitted.

According to an embodiment, since a thermal spreading sheet including a polymer-based layer having relatively low thermal conductivity is included between metal layers having high thermal conductivity, heat generated from a light-emitting device may be easily diffused and emitted in the plane direction in the thermal spreading sheet. Accordingly, it is possible to provide a display apparatus in which the lifespan of the light-emitting device is improved and an afterimage on the display surface is reduced.

Although the embodiments of the disclosure have been described, it is understood that the disclosure should not be limited to these embodiments but various changes and modifications may be made by one ordinary skilled in the art within the spirit and scope of the disclosure as hereinafter claimed.

What is claimed is:
1. A display apparatus comprising:
    a display panel including:
        a display region;
        a non-display region adjacent to the display region; and
        a pixel that provides light to the display region;
    a thermal spreading sheet disposed below the display panel and including a first layer, a second layer, and a third layer, the second layer having a thermal conductivity less than a thermal conductivity of the first layer; and an adhesive layer disposed between the thermal spreading sheet and the display panel and including a light absorbing material, wherein each of the first layer and the third layer has a horizontal thermal resistance in a range of about 1 K/J to about 20 K/J, and the second layer has a vertical thermal resistance in a range of about 500 K/J to about 2000 K/J.

2. The display apparatus of claim 1, wherein each of the first layer and the third layer comprises at least one of silver, copper, gold, silicon carbide, and aluminum.

3. The display apparatus of claim 2, wherein the second layer comprises at least one of polyethylene, polyester, and polyethylene terephthalate.

4. The display apparatus of claim 3, wherein each of the first layer and the third layer has a thickness in a range of about 0.15 mm to about 1 mm, and the second layer has a thickness in a range of about 0.05 mm to about 1 mm.

5. The display apparatus of claim 4, wherein the thermal spreading sheet has a total thickness of about 0.5 mm or more.

6. The display apparatus of claim 1, wherein each of the first layer and the third layer has a thermal conductivity in a range of about 100 W/mK to about 500 W/mK, and the second layer has a thermal conductivity in a range of about 0.1 W/mK to about 0.5 W/mK.

7. The display apparatus of claim 1, further comprising a coating layer spaced apart from the second layer and in contact with the third layer, wherein the third layer is disposed between the coating layer and the second layer.

8. The display apparatus of claim 7, wherein the coating layer has an emissivity of about 0.9 or more.

9. The display apparatus of claim 7, wherein the coating layer has a thickness of about 50 μm or less.

10. The display apparatus of claim 7, further comprising a window disposed on the display panel, wherein the third layer is coupled to the window, and the window and the coating layer define an external appearance of the display apparatus.

11. The display apparatus of claim 1, wherein the adhesive layer has a thickness of about 50 um or less.

12. The display apparatus of claim 1, wherein the adhesive layer has a black color.

13. The display apparatus of claim 1, wherein the thermal spreading sheet includes a first region overlapping the display region and a second region overlapping the non-display region, the second layer is disposed only in the first region, and the first layer and the third layer are in contact with each other in the second region.

14. The display apparatus of claim 1, wherein the thermal spreading sheet includes:

a first region overlapping the display region;

a second region overlapping the non-display region;

a first pattern disposed in the first region; and a second pattern disposed in the second region, and the first pattern has a thermal conductivity less than a thermal conductivity of the second pattern.

15. The display apparatus of claim 1, wherein the thermal spreading sheet further comprises a fourth layer and a fifth layer, the fourth layer is spaced apart from the second layer and has a thermal conductivity less than a thermal conductivity of the third layer, the third layer is disposed between the second layer and the fourth layer, the fourth layer and the second layer include a same material, and the fifth layer and the first layer include a same material.

16. The display apparatus of claim 1, further comprising:

a main circuit board;

a flexible circuit board disposed in the non-display region of the display panel and connecting the display panel and the main circuit board;

a driving chip disposed on the flexible circuit board; and another thermal spreading sheet disposed on the flexible circuit board, the another thermal spreading sheet covering the driving chip, wherein the another thermal spreading sheet and the thermal spreading sheet include a same layer structure.

17. The display apparatus of claim 1, wherein the display panel comprises:

a base substrate in contact with the adhesive layer;

a circuit device layer disposed on the base substrate and including a transistor;

a display device layer including a light-emitting device, the light-emitting device including a first electrode connected to the transistor, a second electrode, and a light-emitting layer disposed between the first electrode and the second electrode;

a first encapsulation layer covering the display device layer; and a light control layer disposed on the first encapsulation layer, and the light control layer includes quantum dots converting the wavelength of source light provided from the display device layer.

18. The display apparatus of claim 17, wherein the light control layer comprises:

a partition wall disposed on the first encapsulation layer and not overlapping the light-emitting layer;

a light control pattern overlapping the light-emitting layer;

a second encapsulation layer covering the light control pattern;

a color filter disposed on the second encapsulation layer; and a protective layer covering the color filter, and the light control pattern includes the quantum dots.

19. The display apparatus of claim 17, wherein the light-emitting device comprises a first light-emitting device, a second light-emitting device, and a third light-emitting device that generate the source light, and a light-emitting layer of the first light-emitting device, a light-emitting layer of the second light-emitting device, and a light-emitting layer of the third light-emitting device have an integral shape.

20. The display apparatus of claim 19, wherein the source light is blue light.

* * * * *